US009178570B2

(12) United States Patent
Deluca (10) Patent No.: US 9,178,570 B2
(45) Date of Patent: Nov. 3, 2015

(54) NFC SYSTEM PROVIDING BATTERY POWER LEVEL MEASUREMENT FEATURES AND RELATED METHODS

(75) Inventor: Michael Joseph Deluca, Boca Raton, FL (US)

(73) Assignee: BlackBerry Limited, Waterloo, ON (CA)

( * ) Notice: Subject to any disclaimer, the term of this patent is extended or adjusted under 35 U.S.C. 154(b) by 648 days.

(21) Appl. No.: 13/036,978

(22) Filed: Feb. 28, 2011

(65) Prior Publication Data

US 2012/0217971 A1    Aug. 30, 2012

(51) Int. Cl.
| | |
|---|---|
| *G01N 27/416* | (2006.01) |
| *H02J 7/00* | (2006.01) |
| *H04B 5/00* | (2006.01) |
| *H04M 1/725* | (2006.01) |
| *G01R 31/36* | (2006.01) |
| *H04M 1/24* | (2006.01) |

(52) U.S. Cl.
CPC ............ *H04B 5/0043* (2013.01); *H04B 5/0031* (2013.01); *H04B 5/0037* (2013.01); *H04M 1/7253* (2013.01); *G01R 31/3689* (2013.01); *H04M 1/24* (2013.01); *H04M 2250/04* (2013.01)

(58) Field of Classification Search
CPC ........................... G01R 31/3648; H02J 7/0004
USPC ................. 320/106; 324/426; 379/1.01, 1.03; 340/635, 636.1
See application file for complete search history.

(56) References Cited

U.S. PATENT DOCUMENTS

| | | | | |
|---|---|---|---|---|
| 5,606,242 | A * | 2/1997 | Hull et al. ..................... | 320/106 |
| 6,084,523 | A * | 7/2000 | Gelnovatch et al. ........ | 340/636.1 |
| 6,163,131 | A * | 12/2000 | Gartstein et al. .............. | 320/118 |
| 6,456,039 | B1 * | 9/2002 | Lauper et al. ................. | 320/107 |
| 7,155,202 | B2 * | 12/2006 | Helal ......................... | 455/404.1 |
| 7,233,247 | B1 * | 6/2007 | Crossno et al. ............ | 340/572.1 |
| 7,679,315 | B2 * | 3/2010 | Kim et al. .................... | 320/106 |
| 7,750,639 | B2 * | 7/2010 | Quint et al. ................... | 324/426 |
| 8,421,405 | B2 * | 4/2013 | Nakajima et al. ............. | 320/106 |

(Continued)

FOREIGN PATENT DOCUMENTS

| | | |
|---|---|---|
| WO | 2008137996 | 11/2008 |
| WO | 2010129369 | 11/2010 |

OTHER PUBLICATIONS

Freudenthal et al. "*Suitability of NFC for Medical Device Communication and Power Delivery*".

(Continued)

*Primary Examiner* — Richard Isla Rodas
*Assistant Examiner* — Michael DiBenedetto
(74) *Attorney, Agent, or Firm* — Guntin & Gust, PLC; Andrew Gust (57) ABSTRACT

A Near Field Communication (NFC) system may include a battery including a battery casing, at least one battery cell carried by the battery casing, at least one power measurement circuit carried by the battery casing and configured to measure a power level of the at least one battery cell, and a first NFC circuit carried by the battery casing and configured to communicate the power level measurement via NFC communication. The NFC system may further include a mobile wireless communications device including a portable housing, a second NFC circuit carried by the portable housing, and a controller carried by the portable housing and configured to cause the second NFC circuit to receive the power level measurement from the first NFC circuit based upon proximity therewith.

16 Claims, 6 Drawing Sheets

(56) References Cited

U.S. PATENT DOCUMENTS

| | | | |
|---|---|---|---|
| 2006/0145660 A1* | 7/2006 | Black et al. | 320/108 |
| 2007/0008141 A1* | 1/2007 | Sweetland | 340/572.7 |
| 2007/0182576 A1* | 8/2007 | Proska et al. | 340/636.1 |
| 2008/0048876 A1* | 2/2008 | Miyajima et al. | 340/636.1 |
| 2008/0049372 A1 | 2/2008 | Loke | 361/143 |
| 2008/0116847 A1 | 5/2008 | Loke et al. | 320/108 |
| 2009/0096413 A1 | 4/2009 | Partovi et al. | 320/108 |
| 2009/0189451 A1* | 7/2009 | Roepke | 307/66 |
| 2010/0264746 A1 | 10/2010 | Kazama et al. | 307/104 |
| 2012/0040611 A1* | 2/2012 | Griffin et al. | 455/41.1 |
| 2012/0075059 A1* | 3/2012 | Fyke et al. | 340/5.21 |
| 2012/0196530 A1* | 8/2012 | Moosavi et al. | 455/41.1 |
| 2012/0208456 A1* | 8/2012 | Hill | 455/41.1 |
| 2012/0220221 A1* | 8/2012 | Moosavi et al. | 455/41.1 |

OTHER PUBLICATIONS

Low-cost temperature sensor to add to RFID inlays http://www.usingrfid.com/news/read.asp?Ic=w2355rx755zo Tuesday Jul. 11, 2006.

Duracell Ultra Advanced with POWERCHECK http://www.duracell.com/en-US/product/ultra-advanced-batteries.jspx Printed Feb. 28, 2011.

* cited by examiner

NFC SYSTEM PROVIDING BATTERY POWER LEVEL MEASUREMENT FEATURES AND RELATED METHODS

TECHNICAL FIELD

This application relates to the field of communications, and more particularly, to electronic devices and related methods that use near-field communication (NFC).

BACKGROUND

Mobile communication systems continue to grow in popularity and have become an integral part of both personal and business communications. Various mobile devices now incorporate Personal Digital Assistant (PDA) features such as calendars, address books, task lists, calculators, memo and writing programs, media players, games, etc. These multi-function devices usually allow electronic mail (email) messages to be sent and received wirelessly, as well as access the Internet via a cellular network and/or a wireless local area network (WLAN), for example.

Some mobile devices incorporate contactless card technology and/or Near Field Communication (NFC) chips. NFC technology is commonly used for contactless short-range communications based on radio frequency identification (RFID) standards, using magnetic field induction to enable communication between electronic devices, including mobile wireless communications devices. These short-range communications include payment and ticketing, electronic keys, identification, device set-up service and similar information sharing. This short-range high frequency wireless communications technology exchanges data between devices over a short distance, such as only a few centimeters.

With NFC technology becoming more widely adopted, it is now used with portable wireless communications devices in association with other short-range wireless communications, such as a wireless Bluetooth connection. For example, an NFC connection is often used to establish a wireless Bluetooth connection in which data for establishing the Bluetooth connection is communicated.

DETAILED DESCRIPTION

The present description is made with reference to the accompanying drawings, in which exemplary embodiments are shown. However, many different embodiments may be used, and thus the description should not be construed as limited to the embodiments set forth herein. Rather, these embodiments are provided so that this disclosure will be thorough and complete. Like numbers refer to like elements throughout, and prime notation is used to indicate similar elements or steps in alternative embodiments.

Generally speaking, a Near Field Communication (NFC) system is disclosed herein which may include a battery comprising a battery casing, at least one battery cell carried by the battery casing, at least one power measurement circuit carried by the battery casing and configured to measure a power level of the at least one battery cell, and a first NFC circuit carried by the battery casing and configured to communicate the power level measurement via NFC communication. The NFC system may further include a mobile wireless communications device comprising a portable housing, a second NFC circuit carried by the portable housing, and a controller carried by the portable housing and configured to cause the second NFC circuit to receive the power level measurement from the first NFC circuit based upon proximity therewith. As such, the mobile wireless communications device may advantageously be used as a tester for determining a power level of the battery.

In some embodiments, the second NFC circuit may comprise an active NFC circuit configured to generate an electromagnetic field, and the first NFC circuit may comprise a passive NFC circuit. As such, the first NFC circuit and the at least one power measurement circuit may be powered by the electromagnetic field.

The battery may further include an internal load carried by the housing, and the power measurement circuit may be configured to measure the power level with the at least one battery cell being temporarily connected to the internal load. The power measurement circuit may also be configured to measure the power level with the at least one battery cell being disconnected from an external load.

The at least one battery cell may have at least one power rating associated therewith, and the first NFC circuit may be further configured to communicate the at least one power rating to the second NFC circuit. The battery may also have a battery identification (ID) associated therewith, and the first NFC circuit may be further configured to communicate the battery ID to the second NFC circuit. By way of example, the battery ID may comprise a Universal Product Code (UPC).

Furthermore, the mobile wireless communications device may also include a display carried by the portable housing, and the controller may be further configured to display a power level indicator for the battery based upon the received power level measurement. By way of example, the mobile wireless communications device may further include a wireless transceiver carried by the portable housing and coupled to the controller. The at least one battery cell may comprise at least one rechargeable battery cell or at least one disposable battery cell, for example.

A related battery is also provided which may include a battery casing, at least one battery cell carried by the battery casing, at least one power measurement circuit carried by the battery casing and configured to measure a power level of the at least one battery cell, and a first NFC circuit carried by the battery casing. The first NFC circuit may be configured to communicate the power level measurement via NFC communication to a second NFC circuit based upon proximity therewith. A related mobile wireless communications device, such as the one described briefly above, is also provided.

A related battery measurement method is for a battery including a battery casing, at least one battery cell carried by the battery casing, at least one power measurement circuit carried by the battery casing, and a first NFC circuit carried by the battery casing. The method may include measuring a power level of the at least one battery cell using at least one power measurement circuit, and communicating the power level measurement from the first NFC circuit to a second NFC circuit of a mobile wireless communications device based upon proximity therewith.

Figure 1:
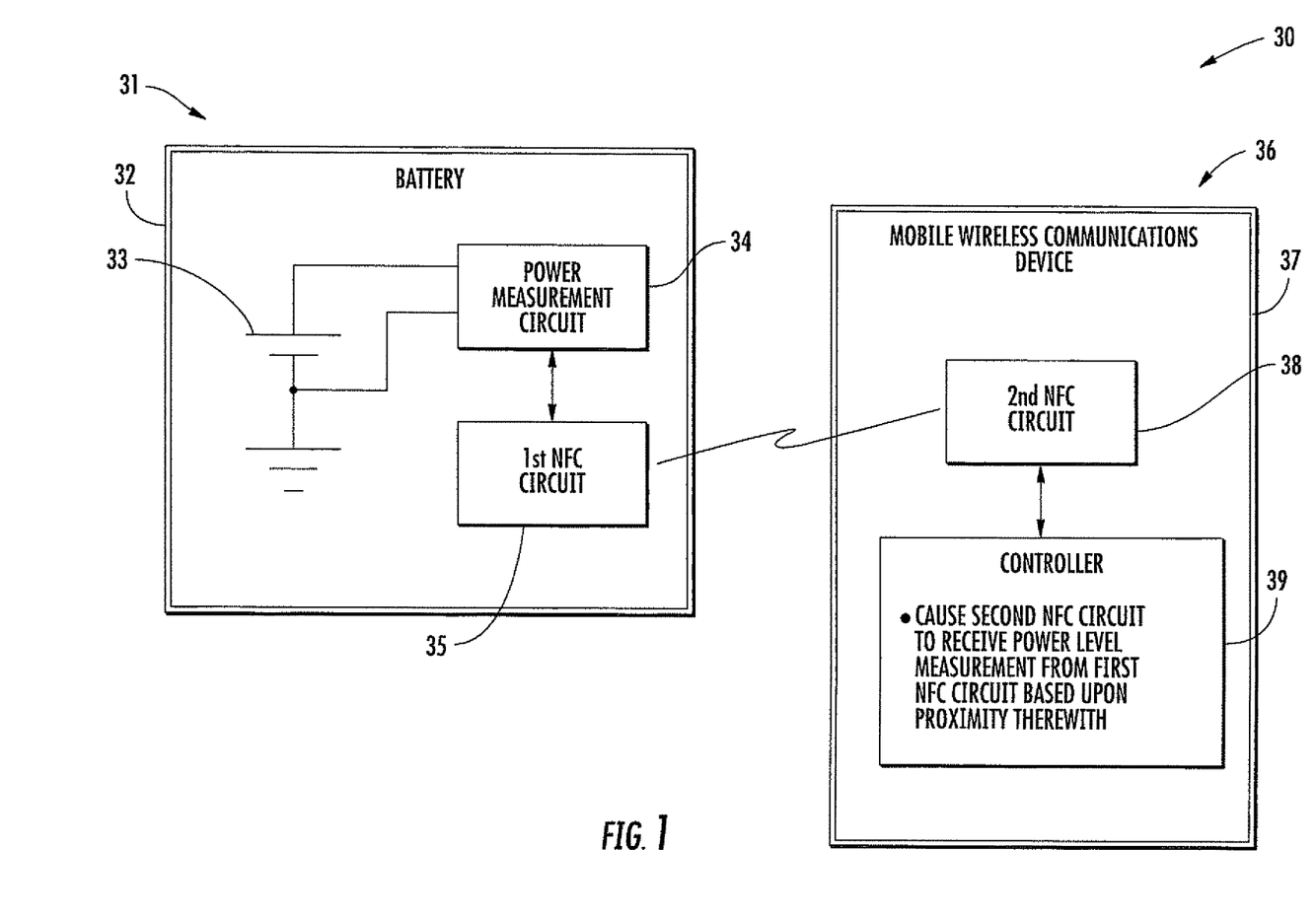
FIG. 1 is a schematic block diagram of an NFC system in accordance with an exemplary embodiment which advantageously provides battery testing or diagnostic features.

Referring initially to FIG. 1, a Near Field Communication (NFC) system 30 is first described which may advantageously be used for operations such as battery testing, diagnostics, inventory management, etc. More particularly, the system 30 illustratively includes a battery 31 battery comprising a battery casing 32, one or more battery cells 33 carried by the battery casing 32, and one or more power measurement circuits 34 carried by (i.e., within) the battery casing 32 and configured to measure a power level of the battery cell 33, as will be discussed further below. The battery 31 also advantageously includes a first NFC circuit 35 carried by (i.e., within) the battery casing 32 and configured to communicate the power level measurement via NFC communication.

NFC is a short-range wireless communications technology in which NFC-enabled devices are "swiped," "bumped" or otherwise moved in close proximity to communicate. In one non-limiting example implementation, NFC may operate at 13.56 MHz and with an effective range of about 10 cm, but other suitable versions of near-field communication which may have different operating frequencies, effective ranges, etc., for example, may also be used.

The system 30 further illustratively includes a mobile wireless communications device 36 (also referred to as a "mobile device" herein) comprising a portable housing 37, a second NFC circuit 38 carried by the portable housing 37, and a controller 39 carried by the portable housing 37. The controller 39 may be configured to cause the second NFC circuit 38 to receive the power level measurement from the first NFC circuit 35 based upon proximity therewith, as discussed above. In this way, the mobile device 36 provides a wireless battery tester in that it receives information from the battery 31, including its current power level, and advantageously conveys this information in a relatively quick and simple fashion, i.e., by swiping or bumping the battery and mobile device to initiate NFC communications therebetween. By way of example, the controller 39 may be implemented using a combination of hardware (e.g., microprocessor, etc.) and non-transitory computer readable medium components having computer-executable instructions for performing the various operations described herein.

Figure 2:
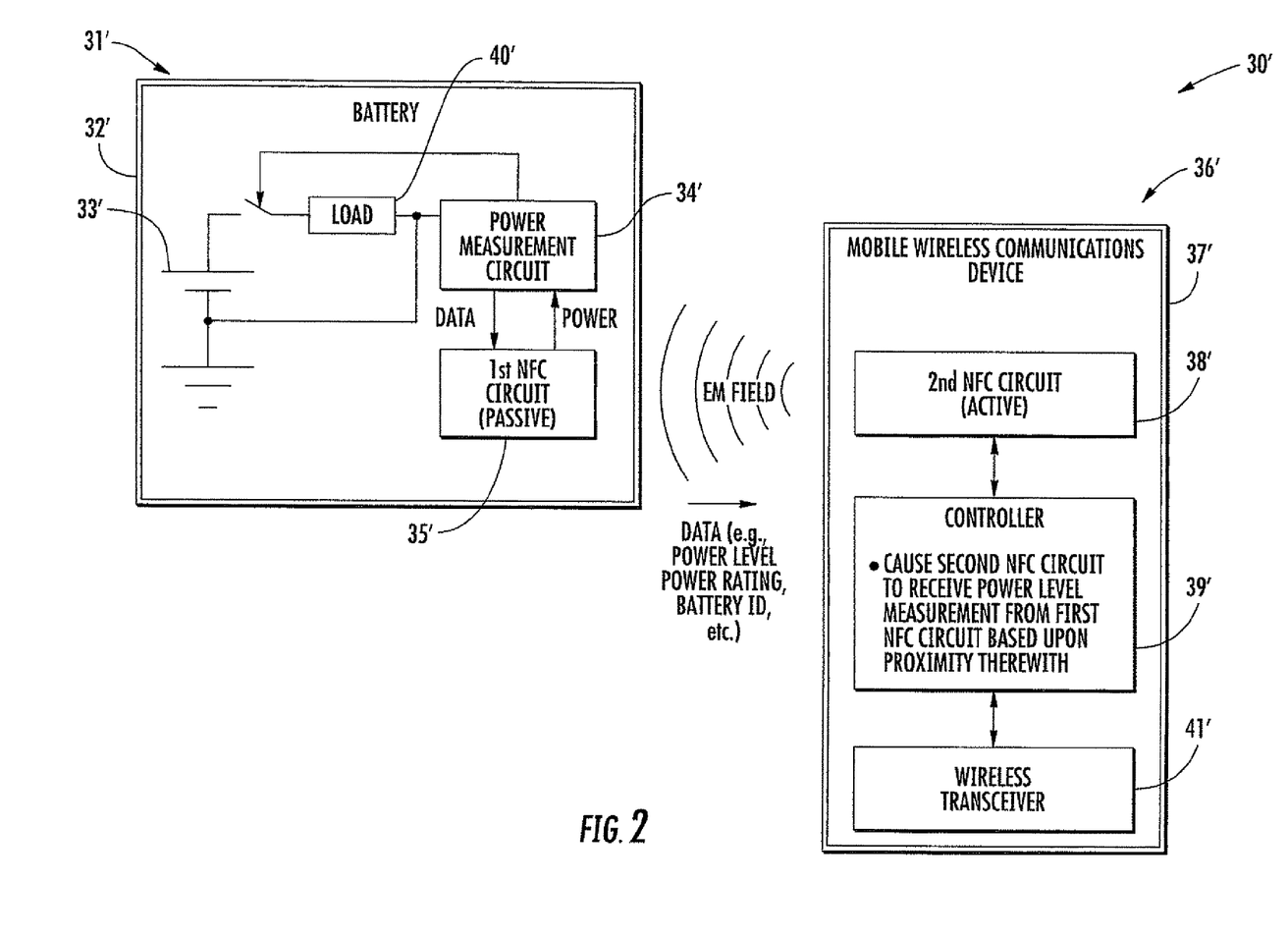
FIG. 2 is a schematic block diagram of an alternative embodiment of the NFC system of FIG. 1.

Referring additionally to FIG. 2, in this exemplary embodiment the second NFC circuit 38' is an active NFC circuit configured to generate an electromagnetic (EM) field, and the first NFC circuit 35' is a passive NFC circuit. As such, the first NFC circuit 35' and the power measurement circuit 34' may be powered by the electromagnetic field. That is, the power measurement circuit 34' and first NFC circuit 35' need not draw power from the battery cell 33', and thereby prevent the undesirable drawing down power from the cell 33'. Rather, the first NFC circuit 35' is powered by the electromagnetic field generated by the second (i.e., active) NFC circuit 38', which in turn provides power to the power measurement circuit 34'. Once the power measurement circuit 34' is powered by the first NFC circuit 35', it performs is power level measurement and relays this data back to the first NFC circuit 35', which then transmits the power level data to the second NFC circuit 38' via NFC communications.

The battery 31' may further include an internal load 40' carried by the housing 32', and the power measurement circuit 34' may be configured to measure the power level with the battery cell 33' being temporarily connected to the internal load 40'. By way of example, the power measurement circuit 34' may comprise an analog-to-digital converter (ADC) which converts a voltage level of the battery cell 33' to digital data, which is provided to the first NFC circuit 35'. Such configurations may be relatively inexpensive and, therefore, advantageous for relatively low-cost batteries, such as disposable batteries, for example. In other embodiments where the battery 31' is more expensive, such as a rechargeable battery for an electronic device, additional functionality may be desirable and it may be cost effective for the power measurement circuit 34' to comprise a microprocessor. The microprocessor may perform other functions as well, such as tracking or managing power consumption and recharging, for example.

The power measurement circuit 34' may be configured to perform various power level determining algorithms depending upon the given implementation, as will be appreciated by those skilled in the art. Moreover, in some embodiments the power measurement circuit 34' may also be configured to indicate a battery status or other information regarding the state of the battery 31', as will be discussed further below. The power measurement circuit 34' may also be configured to measure the power level with the battery cell 33' being disconnected from an external load, e.g., not inserted within an electronic device. In this way, the power or charge level of the battery cell 33' may advantageously be determined without having to first plug the battery 31' into an electronic device or a physical battery tester, as is typically required. Rather, a relatively quick NFC swipe of the battery 31' with the mobile device 36' provides a more convenient approach for determining the power level.

Figure 3:
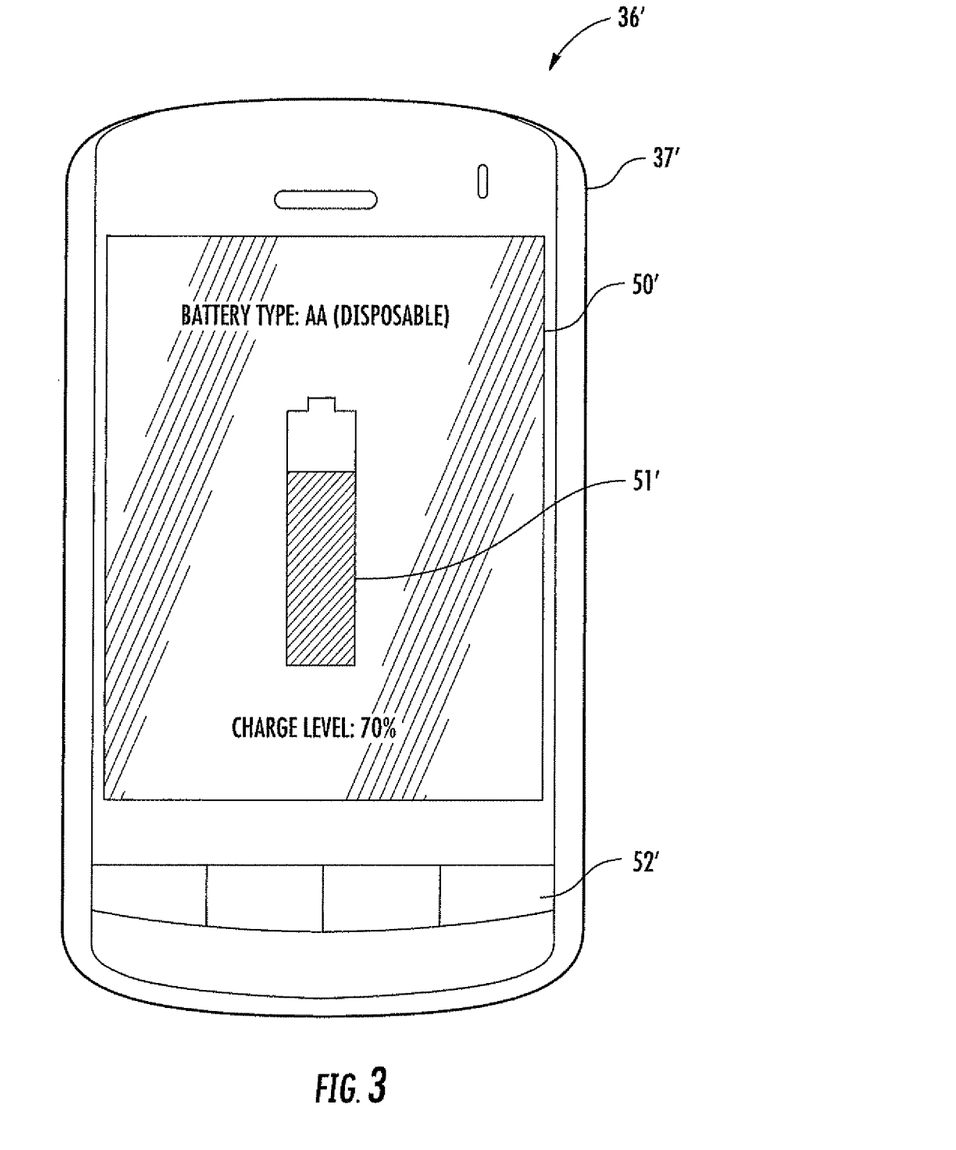
FIG. 3 is a front view of an exemplary implementation of the mobile wireless communications device of the system of FIG. 2.

Moreover, this also allows for other important battery information to be quickly conveyed, which may not be possible with conventional battery testers. Referring additionally to FIG. 3, the mobile device 36' also illustratively includes a display 50' and input buttons 52', and the controller 39' may be further configured to display a power level indicator 51' for the battery 31' based upon the received power level measurement. Here, the battery level indicator 51' takes the form of a battery graphic on the display 50' with a fill level corresponding to the measured power (i.e., charge) level of the battery cell 33', which in the present example is 70% of total capacity.

The battery cell 33' may also have one or more power ratings associated therewith, and the first NFC circuit 35' may be further configured to communicate the power rating(s) to the second NFC circuit 38'. For example, the power rating may be a voltage or amp hour rating, or correspond to a particular type of battery. Here, the power rating for the battery 31' is a AA disposable battery, which will typically have an initial voltage level of about 1.6V. The indicator 51' in this example also is in the shape of the particular battery 31' that has been swiped with the mobile device 36', namely a AA battery. The battery type and charge or power level is further indicated on the display with alphanumeric characters, as shown. In some embodiments, an audio output (e.g., speech or tone) may be used to convey power level, etc., information in addition to or instead of the display 50'.

Figure 4:
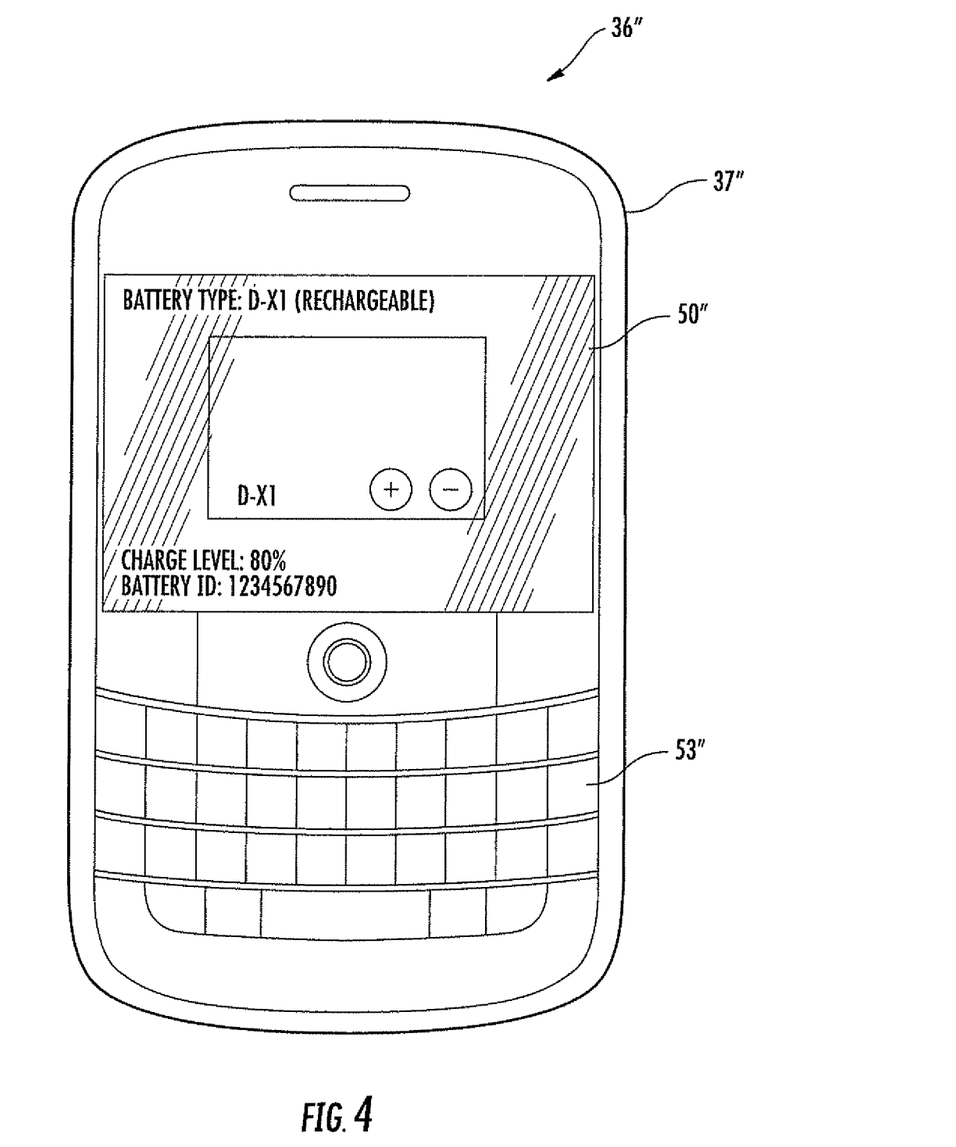
FIG. 4 is a front view of an alternative implementation of the mobile wireless communications device of the system of FIG. 2.

In accordance with another example shown in FIG. 4, an alternative embodiment of the mobile device 36" illustratively includes a keypad 53". In this example, the battery 31" of the mobile device 36" (not shown in FIG. 4) is a rechargeable battery which has a battery identification (ID) associated therewith, such as a serial or model number which uniquely identifies the individual battery type, manufacturer, etc., or which serves as a product code. A picture or graphic representation of the battery 31" is shown on the display, which has a battery type D-X1, as well as an identification number 1234567890. Such information may be used for inventory control of various different types of batteries, and for purchasing thereof (e.g., the battery ID may be used instead of a bar code for point-of-sale (POS) checkout). That is, the passive (or active) NFC circuit of the battery may be used to facilitate retail transactions by conveying a Universal Product Code (UPC) battery ID at an NFC-enabled POS terminal. Here again, the NFC circuit of the battery is configured to communicate the battery ID, power level, battery type, or other data for the battery as appropriate for the particular battery type to another circuit. In the illustrated example, the power or charge level for the battery 31" is 80%.

In the case where the mobile device 36" is a mobile phone, for example, the above-described approach may be particularly advantageous for users that have multiple rechargeable batteries for their phones. Ordinarily, to check the charge level of a spare battery, the current battery would have to be removed from the mobile phone and the new one inserted. However, this process reboots the mobile phone and causes it to lose its connection to its wireless (e.g., cellular) network, which may render the phone unusable for several minutes. Yet, the above-described approach advantageously allows the charge level of the spare rechargeable battery to be determined without having to remove the current battery from the mobile phone. In this way, if the spare battery has a charge level that is relatively low, the unnecessary down-time associated with a battery swap may advantageously be avoided. Furthermore, the spare battery may be independently recharged to various intermediate or full levels and the charge level determined independent of the battery recharging apparatus.

Referring again to FIG. 2, the mobile device 31' may further include a wireless transceiver 41' carried by the portable housing 37' and coupled to the controller 39'. By way of example, the wireless transceiver 41' may comprise a cellular transceiver, wireless local area network (WLAN) transceiver (e.g., IEEE 802.11x), WiMAX transceiver, Bluetooth transceiver, etc. Example mobile devices that may be used for the above-described embodiments may include portable or personal media players (e.g., MP3 players, video players, etc.), remote controls (e.g., television or stereo remotes, etc.), portable gaming devices, portable or mobile telephones, smartphones, etc.

Figure 5:
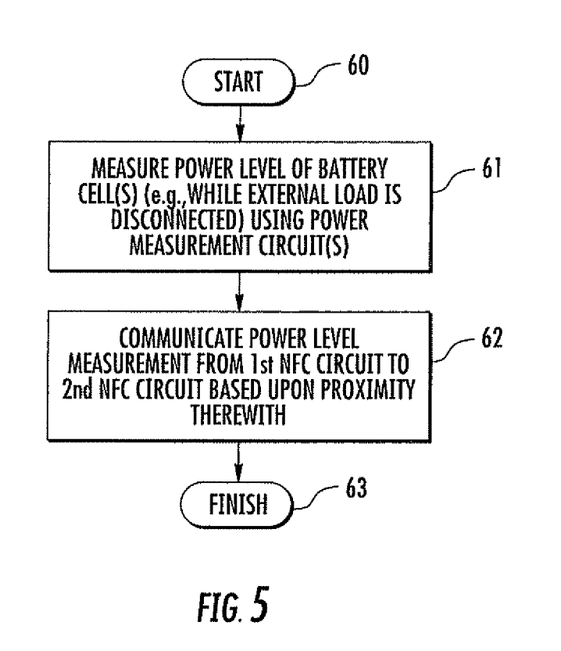
FIG. 5 is a flow diagram illustrating method aspects associated with the systems of FIG. 1 or 2.

A related battery measurement method is now described with reference to FIG. 5. Beginning at Block 60, the method illustratively includes measuring a power level of the battery cell 33 using the power measurement circuit 34, at Block 61. Again, this may advantageously be done while the battery 31 is disconnected from an external load, as discussed above. The method further illustratively includes communicating the power level measurement from the first NFC circuit 35 to the second NFC circuit 38 based upon proximity therewith, at Block 62, which illustratively concludes the method illustrated in FIG. 5 (Block 63), although in an actual implementation these steps may be repeated multiple times.

Exemplary components of a mobile wireless communications device 1000 that may be used in accordance with the above-described embodiments are further described below with reference to FIG. 6. The device 1000 illustratively includes a housing 1200, a keypad 1400 and an output device 1600. The output device shown is a display 1600, which may comprise a full graphic LCD. Other types of output devices may alternatively be utilized. A processing device 1800 is contained within the housing 1200 and is coupled between the keypad 1400 and the display 1600. The processing device 1800 controls the operation of the display 1600, as well as the overall operation of the mobile device 1000, in response to actuation of keys on the keypad 1400.

The housing 1200 may be elongated vertically, or may take on other sizes and shapes (including clamshell housing structures). The keypad may include a mode selection key, or other hardware or software for switching between text entry and telephony entry.

Figure 6:
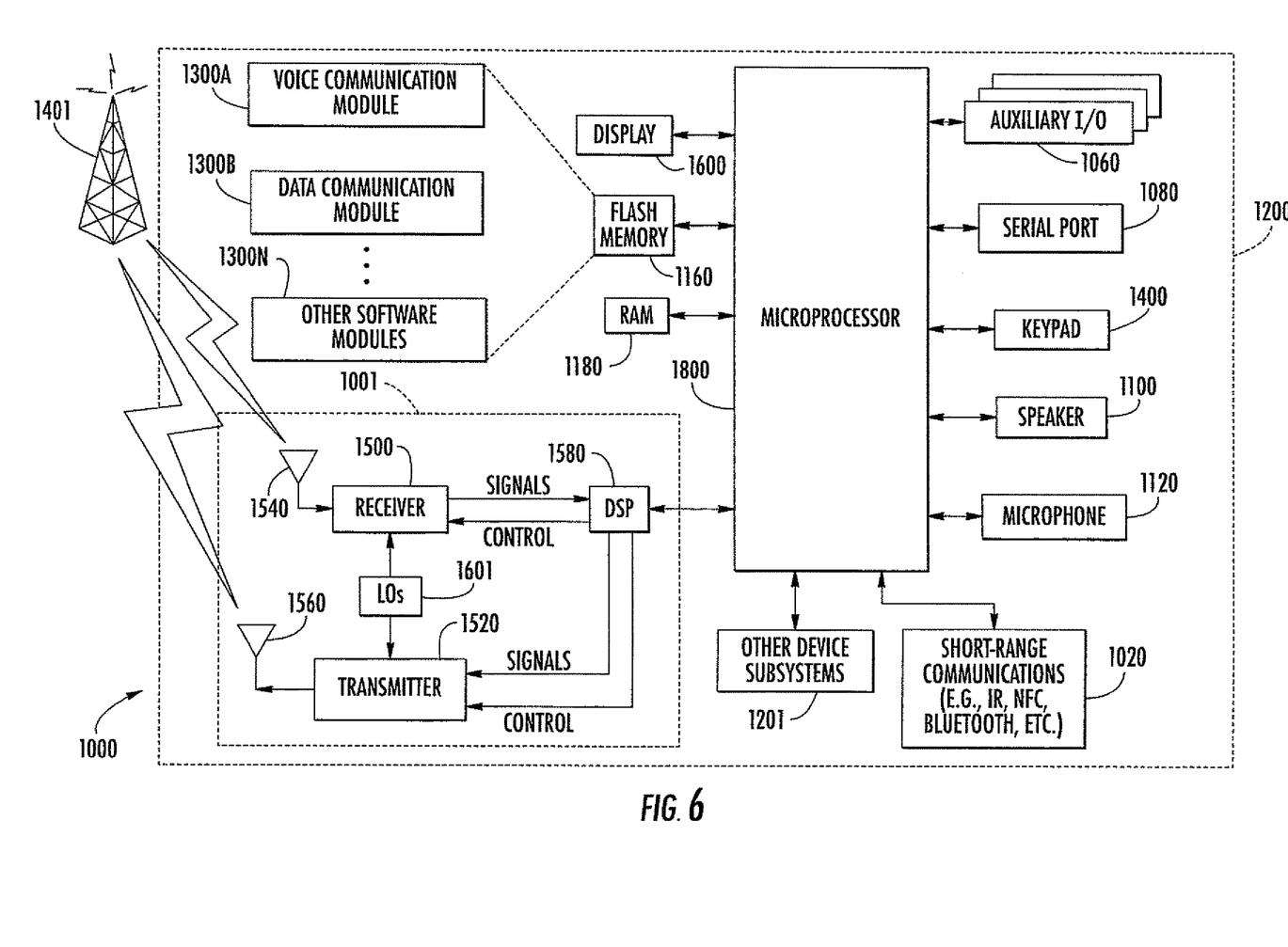
FIG. 6 is a schematic block diagram illustrating exemplary mobile wireless device components that may be used with the mobile wireless communications devices of FIGS. 1-4.

In addition to the processing device 1800, other parts of the mobile device 1000 are shown schematically in FIG. 6. These include a communications subsystem 1001; a short-range communications subsystem 1020; the keypad 1400 and the display 1600, along with other input/output devices 1060, 1080, 1100 and 1120; as well as memory devices 1160, 1180 and various other device subsystems 1201. The mobile device 1000 may comprise a two-way RF communications device having data and, optionally, voice communications capabilities. In addition, the mobile device 1000 may have the capability to communicate with other computer systems via the Internet.

Operating system software executed by the processing device 1800 is stored in a persistent store, such as the flash memory 1160, but may be stored in other types of memory devices, such as a read only memory (ROM) or similar storage element. In addition, system software, specific device applications, or parts thereof, may be temporarily loaded into a volatile store, such as the random access memory (RAM) 1180. Communications signals received by the mobile device may also be stored in the RAM 1180.

The processing device 1800, in addition to its operating system functions, enables execution of software applications 1300A-1300N on the device 1000. A predetermined set of applications that control basic device operations, such as data and voice communications 1300A and 1300B, may be installed on the device 1000 during manufacture. In addition, a personal information manager (PIM) application may be installed during manufacture. The PIM may be capable of organizing and managing data items, such as e-mail, calendar events, voice mails, appointments, and task items. The PIM application may also be capable of sending and receiving data items via a wireless network 1401. The PIM data items may be seamlessly integrated, synchronized and updated via the wireless network 1401 with corresponding data items stored or associated with a host computer system.

Communication functions, including data and voice communications, are performed through the communications subsystem 1001, and possibly through the short-range communications subsystem. The communications subsystem 1001 includes a receiver 1500, a transmitter 1520, and one or more antennas 1540 and 1560. In addition, the communications subsystem 1001 also includes a processing module, such as a digital signal processor (DSP) 1580, and local oscillators (LOs) 1601. The specific design and implementation of the communications subsystem 1001 is dependent upon the communications network in which the mobile device 1000 is intended to operate. For example, a mobile device 1000 may include a communications subsystem 1001 designed to operate with the Mobitex™, Data TAC™ or General Packet Radio Service (GPRS) mobile data communications networks, and also designed to operate with any of a variety of voice communications networks, such as AMPS, TDMA, CDMA, WCDMA, PCS, GSM, EDGE, etc. Other types of data and voice networks, both separate and integrated, may also be utilized with the mobile device 1000. The mobile device 1000 may also be compliant with other communications standards such as 3GSM, 3GPP, UMTS, 4G, etc.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore typically involves use of a subscriber identity module, commonly referred to as a SIM card, in order to operate on a GPRS network.

When required network registration or activation procedures have been completed, the mobile device 1000 may send and receive communications signals over the communication network 1401. Signals received from the communications network 1401 by the antenna 1540 are routed to the receiver 1500, which provides for signal amplification, frequency down conversion, filtering, channel selection, etc., and may also provide analog to digital conversion. Analog-to-digital conversion of the received signal allows the DSP 1580 to perform more complex communications functions, such as demodulation and decoding. In a similar manner, signals to be transmitted to the network 1401 are processed (e.g. modulated and encoded) by the DSP 1580 and are then provided to the transmitter 1520 for digital to analog conversion, frequency up conversion, filtering, amplification and transmission to the communication network 1401 (or networks) via the antenna 1560.

In addition to processing communications signals, the DSP 1580 provides for control of the receiver 1500 and the transmitter 1520. For example, gains applied to communications signals in the receiver 1500 and transmitter 1520 may be adaptively controlled through automatic gain control algorithms implemented in the DSP 1580.

In a data communications mode, a received signal, such as a text message or web page download, is processed by the communications subsystem 1001 and is input to the processing device 1800. The received signal is then further processed by the processing device 1800 for an output to the display 1600, or alternatively to some other auxiliary I/O device 1060. A device may also be used to compose data items, such as e-mail messages, using the keypad 1400 and/or some other auxiliary I/O device 1060, such as a touchpad, a rocker switch, a thumb-wheel, or some other type of input device. The composed data items may then be transmitted over the communications network 1401 via the communications subsystem 1001.

In a voice communications mode, overall operation of the device is substantially similar to the data communications mode, except that received signals are output to a speaker 1100, and signals for transmission are generated by a microphone 1120. Alternative voice or audio I/O subsystems, such as a voice message recording subsystem, may also be implemented on the device 1000. In addition, the display 1600 may also be utilized in voice communications mode, for example to display the identity of a calling party, the duration of a voice call, or other voice call related information.

The short-range communications subsystem enables communication between the mobile device 1000 and other proximate systems or devices, which need not necessarily be similar devices. For example, the short-range communications subsystem may include an infrared device and associated circuits and components, or a Bluetooth™ communications module to provide for communication with similarly-enabled systems and devices.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

That which is claimed is:

1. A Near Field Communication (NFC) system comprising:
   a first battery comprising:
     a first battery casing,
     a first battery cell carried by the first battery casing,
     a first power measurement circuit carried by the first battery casing and configured to measure a first power level measurement of the first battery cell, and
     a first NFC circuit carried by the first battery casing and configured to communicate the first power level measurement via NFC communication, wherein the first power level measurement is measured and communicated using an analog-to-digital converter without using a microprocessor;
   a second battery comprising:
     a second battery casing,
     a second battery cell carried by the second battery casing, and
     a second power measurement circuit carried by the second battery casing and configured to measure a second power level measurement of the second battery cell; and
   a mobile wireless communications device comprising:
     a portable housing coupled to the second battery,
     a second NFC circuit carried by the portable housing, and
     a controller carried by the portable housing and supplied with power by the second battery cell of the second battery, the controller being configured to:
       receive the second power level measurement from the second power measurement circuit of the second battery, and
       receive the first power level measurement from the first battery via the NFC communication between the first and second NFC circuits and without uncoupling the second battery from the portable housing or ceasing a supply of the power from the second battery cell of the second battery to the controller.

2. The NFC system of claim 1 wherein the second NFC circuit comprises an active NFC circuit configured to generate an electromagnetic field; wherein the first NFC circuit of the first battery comprises a passive NFC circuit; and wherein the first NFC circuit and the first power measurement circuit of the first battery are powered by the electromagnetic field.

3. The NFC system of claim 1 further comprising an internal load carried by the first battery casing of the first battery; and wherein the first power measurement circuit of the first battery is configured to measure the first power level with the first battery cell of the first battery being temporarily connected to the internal load.

4. The NFC system of claim 1 wherein the first battery cell of the first battery has a first power rating associated therewith; and wherein the controller is configured to present the power rating at a display.

5. The NFC system of claim 1 wherein the mobile wireless communications device further comprises a display carried by the portable housing; and wherein the controller is further configured to display a power level indicator for at least one of the first and second batteries based upon the received first and second power level measurements.

6. The NFC system of claim 1 wherein the mobile wireless communications device further comprises a wireless transceiver carried by the portable housing and coupled to the controller.

7. The NFC system of claim 1 wherein the first battery cell comprises a rechargeable battery cell.

8. The NFC system of claim 1 wherein the first battery cell comprises a disposable battery cell.

9. A mobile wireless communications device for use with first and second batteries each comprising a battery casing, at least one battery cell carried by the battery casing, at least one power measurement circuit carried by the battery casing and configured to measure a power level of the at least one battery cell, and a first NFC circuit carried by the battery casing and configured to communicate the power level measurement via NFC communication, the mobile wireless communications device comprising:
 a portable housing coupled to the first battery;
 a second NFC circuit carried by the portable housing;
 a display carried by the portable housing; and
 a controller carried by the portable housing and supplied with power by the at least one battery cell of the first battery, the controller being configured to receive the power level measurement from the at least one power measurement circuit of the first battery,
 receive the power level measurement from the second battery via the second NFC circuit without uncoupling the first battery from the portable housing or ceasing the supply of power from the first battery to the controller, and
 display a power level indicator for at least one of the first and second batteries on the display based upon the received power level measurements,
 wherein the power level measurement is measured and communicated by the second battery using an analog-to-digital converter of the second battery without using a microprocessor of the second battery.

10. The mobile wireless communications device of claim 9 wherein the second NFC circuit comprises an active NFC circuit configured to generate an electromagnetic field wherein the first NFC circuit of the second battery comprises a passive NFC circuit and wherein the first NFC circuit and the at least one power measurement circuit of the second battery are powered by the electromagnetic field.

11. The mobile wireless communications device of claim 9 wherein the at least one battery cell of the second battery has at least one power rating associated therewith; wherein the second NFC circuit is further configured to receive the at least one power rating from the first NFC circuit of the second battery; and wherein the controller is further configured to display the power rating of the second battery on the display based upon the received at least one power rating.

12. A method for using a mobile wireless communications device with first and second batteries each comprising a battery casing, at least one battery cell carried by the battery casing, at least one power measurement circuit carried by the battery casing, and a first NFC circuit carried by the battery casing, the mobile wireless communications device comprising a portable housing coupled to the first battery and a second NFC circuit, the method comprising:
 measuring respective power levels of the at least one battery cell of the first and second batteries using the power measurement circuits of the first and second batteries;
 communicating the power level measurement from the at least one power measurement circuit of the first battery to the mobile wireless communications device;
 communicating the power level measurement from the first NFC device of the second battery to the second NFC circuit without uncoupling the first battery from the portable housing or ceasing the supply of power from the first battery to the mobile wireless communications device, wherein the power level measurement of the second battery is measured and communicated by the second battery using an analog-to-digital converter of the second battery without using a microprocessor of the second battery.

13. The method of claim 12 wherein the second NFC circuit comprises an active NFC circuit configured to generate an electromagnetic field;
 wherein the first NFC circuit of the second battery comprises a passive NFC circuit; and further comprising powering the first NFC circuit and the at least one power measurement circuit of the second battery from the electromagnetic field.

14. The method of claim 12 wherein the second battery further comprises an internal load carried by the battery casing; and wherein measuring comprises measuring the power level from the second battery using the power measurement circuit with the at least one battery cell being temporarily connected to the internal load.

15. The method of claim 12 wherein the at least one battery cell of the second battery has at least one power rating associated therewith; and wherein communicating further comprises communicating the at least one power rating from the first NFC circuit of the second battery to the second NFC circuit.

16. The method of claim 12 wherein the mobile wireless communications device further comprises a display; and further comprising displaying a power level indicator for at least one of the first and second batteries on the display based upon the received power level measurement.

* * * * *